United States Patent
Zhang

(10) Patent No.: US 9,859,895 B2
(45) Date of Patent: Jan. 2, 2018

(54) LEVEL SHIFT DEVICE AND METHOD

(71) Applicant: Shenzhen China Star Optoelectronics Technology Co., Ltd., Shenzhen, Guangdong (CN)

(72) Inventor: Hua Zhang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 219 days.

(21) Appl. No.: 14/783,861

(22) PCT Filed: Sep. 15, 2015

(86) PCT No.: PCT/CN2015/089599
§ 371 (c)(1),
(2) Date: Oct. 10, 2015

(87) PCT Pub. No.: WO2017/031794
PCT Pub. Date: Mar. 2, 2017

(65) Prior Publication Data
US 2017/0155390 A1    Jun. 1, 2017

(51) Int. Cl.
*H03K 19/0185* (2006.01)
*H03K 5/1534* (2006.01)
(52) U.S. Cl.
CPC ..... *H03K 19/01855* (2013.01); *H03K 5/1534* (2013.01)

(58) Field of Classification Search
CPC . H03K 5/1534; H03K 5/156; H03K 19/01855
See application file for complete search history.

(56) References Cited

U.S. PATENT DOCUMENTS

| 7,696,803 | B2* | 4/2010 | Arisaka | H03K 5/156 |
| | | | | 327/276 |
| 2014/0198023 | A1* | 7/2014 | Hsu | G09G 3/3674 |
| | | | | 345/99 |

* cited by examiner

*Primary Examiner* — Jeffrey Zweizig
(74) *Attorney, Agent, or Firm* — Andrew C. Cheng

(57) ABSTRACT

The present invention teaches a level shift device and a related method. The level shift device contains a first input terminal, a second input terminal, a number of output terminals, and a pulse generation circuit. The first input terminal is for receiving a first pulse input signal. The second input terminal is for receiving a second pulse input signal. The pulse generation circuit cyclically produces pulse output signals, one on each output terminal, according to the first and second pulse input signals. The level shift device further contains a third input terminal for receiving a third pulse input signal. The pulse generation circuit controls the number of pulse output signals produced within each cycle according to third pulse input signal. The present invention is able to produce various numbers of pulse output signals, which is flexible for different applications without investing a new design.

10 Claims, 6 Drawing Sheets

LEVEL SHIFT DEVICE AND METHOD

BACKGROUND OF THE INVENTION

1. Field of the Invention

The present invention generally relates to display technologies, and particularly relates to a level shift device and method.

2. The Related Arts

An array substrate of a liquid crystal display (LCD) device usually contains a GOA (Gate Driver on Array) circuit by forming gate scan circuit on the array substrate using ordinary array substrate process. FIG. 1(a) is a schematic diagram showing how a level shift IC 10 commonly adopted in the GOA circuit is connected. FIG. 1(b) is a waveform diagram showing the input and output clock signals of the level shift IC 10. In this example, there are 8 input clock signals and there are output clock signal of the same number. A Timer Control Register (TCON) 11 provides the 8 input clock signals (ck1~ck8) to the level shift IC 10 where they are converted from a low level voltage (3.3V) into 8 output clock signals of a high level voltage (usually about 30V). The output clock signals correspond one-on-one to the input clock signals. This type of level shift IC is advantageous that it is simple to input clock signals and that it can be applied to situations where a fewer number of input clock signals is required. For example, it is possible that only 6 inputs and outputs are used on this 8-in-8-out level shift IC. The disadvantage is that a greater number of input clock signals is required (as the number of inputs has to be identical to the number of outputs). This will consume many of the TCON 11's pins, meaning both the TCON 11's packaging and cost are increased.

FIG. 2(a) is a schematic diagram showing how a level shift IC 20 of another type is connected. FIG. 2(b) is a waveform diagram showing the input and output clock signals of the level shift IC 10. As illustrated, the level shift IC only takes two input clock signals (Signal 1 and Signal 2) from the TCON 21. The rising edges of Signal 1's waveform trigger the rising edges of the output clock signal waveforms. The rising edges of Signal 2's waveform trigger the falling edges of the output clock signal waveforms. The pulses of the output clock signal are as such sequentially formed until the last output clock signal's pulse is produced where the process is repeated to produce the first output clock signal's pulse. The advantage of the level shift IC of this type is that a fewer number of input clock signals is required and fewer pins of TCON 21 are consumed. The disadvantage is that there is a fixed number of output clock signals, and they are sequential and continuous. Therefore the level shift IC cannot be applied when a fewer number of clock signals is needed. For example, an 8-output level shift IC cannot be used when only 6 is required as, if the last 2 outputs are not used, the output clock signals would be delayed. As shown in FIG. 2(b), there are 3 clock periods, instead of 1 clock period, between the last output clock signal ck6 of a previous cycle and the first output clock signal ck1 of a next cycle.

SUMMARY OF THE INVENTION

The present invention teaches a level shift device and a related method that can provide various numbers of pulse output signals for different applications without investing a new design.

The level shift device contains a first input terminal, a second input terminal, a third input terminal, a number of output terminals, and a pulse generation circuit. The first input terminal is for receiving a first pulse input signal, the second input terminal is for receiving a second pulse input signal, and the third input terminal is for receiving a third pulse input signal. The pulse generation circuit cyclically produces pulse output signals, one on each output terminal, according to the first and second pulse input signals. The pulse generation circuit controls the number of pulse output signals produced within each cycle of pulse output signals according to the third pulse input signal where a current cycle is terminated and a next cycle is started in accordance with each controlling edge of the third pulse input signal. The third pulse input signal has a frequency that is ¼, ⅙, or ⅛ of the first pulse input signal's frequency.

The pulse generation circuit contains a pulse generation unit, a first detection unit for receiving the first pulse input signal that, in response to the first pulse input signal, triggers the pulse generation unit to produce a rising edge sequentially in each pulse output signal, a second detection unit for receiving the second pulse input signal that, in response to the second pulse input signal, triggers the pulse generation unit to produce a falling edge sequentially in each pulse output signal, and a third detection unit for receiving the third pulse input signal that, in response to the third pulse input signal, resets the first and second detection units.

The pulse generation unit contains a number of first switch and a number of second switch. Each output terminal is connected to a first switch and a second switch. The first detection unit, in response to each controlling edge of the first pulse input signal, turns on the first switch and turns off the second switch connected to each output terminal sequentially so that each output terminal is sequentially connected to a high reference level. The second detection unit, in response to each controlling edge of the second pulse input signal, turns off the first switch and turns on the second switch connected to each output terminal sequentially so that each output terminal is sequentially connected to a low reference level.

The present invention teaches another level shift device which contains a first input terminal, a second input terminal, a third input terminal, a number of output terminals, and a pulse generation circuit. The first input terminal is for receiving a first pulse input signal, the second input terminal is for receiving a second pulse input signal, and the third input terminal is for receiving a third pulse input signal. The pulse generation circuit cyclically produces pulse output signals, one on each output terminal, according to the first and second pulse input signals. The pulse generation circuit controls the number of pulse output signals produced within each cycle of pulse output signals according to the third pulse input signal.

The pulse generation circuit terminates a current cycle and starts a next cycle in accordance with each controlling edge of the third pulse input signal.

The pulse generation circuit contains a pulse generation unit, a first detection unit for receiving the first pulse input signal that, in response to the first pulse input signal, triggers the pulse generation unit to produce a rising edge sequentially in each pulse output signal, a second detection unit for receiving the second pulse input signal that, in response to the second pulse input signal, triggers the pulse generation unit to produce a falling edge sequentially in each pulse output signal, and a third detection unit for receiving the third pulse input signal that, in response to the third pulse input signal, resets the first and second detection units.

The pulse generation unit contains a number of first switch and a number of second switch. Each output terminal is connected to a first switch and a second switch. The first detection unit, in response to each controlling edge of the first pulse input signal, turns on the first switch and turns off the second switch connected to each output terminal sequentially so that each output terminal is sequentially connected to a high reference level. The second detection unit, in response to each controlling edge of the second pulse input signal, turns off the first switch and turns on the second switch connected to each output terminal sequentially so that each output terminal is sequentially connected to a low reference level.

The third pulse input signal has a frequency that is ¼, ⅙, or ⅛ of the first pulse input signal's frequency.

The present invention also teaches a level shift method which contains the steps of receiving a first pulse input signal and a second pulse input signal, cyclically producing a number of pulse output signals in accordance with the first and second pulse input signals; and receiving a third pulse input signal and, in accordance with the third pulse input signal, setting the number of pulse output signals produced in each cycle.

The step of setting the number of pulse output signals contains the step of, in response to each controlling edge of the third pulse input signal, terminating a current cycle of pulse output signals and starting a next cycle of pulse output signals.

The step of cyclically producing a number of pulse output signals contains the steps of, in response to the first pulse input signal, producing a rising edge sequentially in each pulse output signal; and, in response to the second pulse input signal, producing a falling edge sequentially in each pulse output signal.

The third pulse input signal has a frequency that is ¼, ⅙, or ⅛ of the first pulse input signal's frequency.

As described, the present invention employs the first and second pulse input signals to control the rising and falling edges for each pulse output signals in cycles of pulse output signals. Then, the third pulse input signal is used to terminate a current cycle and start a new cycle. The present invention is therefore able to produce various numbers of pulse output signals suitable for different applications.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 3:
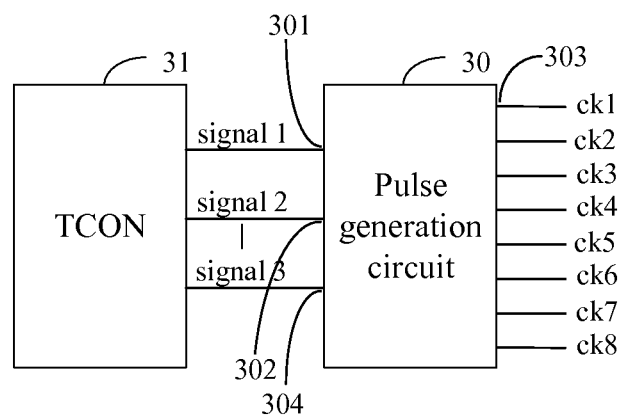
FIG. 3 is a schematic diagram showing how a level shift device according to an embodiment of the present invention is connected.

FIG. 3 is a schematic diagram showing how a level shift device according to an embodiment of the present invention is connected. As illustrated, the level shift device contains a first input terminal 301, a second input terminal 302, a number of output terminals 303, and a pulse generation circuit 30. The first input terminal 301 is for receiving a first pulse input signal 1. The second input terminal 302 is for receiving a second pulse input signal 2. The pulse generation circuit 30 cyclically produces pulse output signals ck1, ck2, ck3, ck4, ck5, ck6, ck7, ck8, one on each output terminal 303, according to the first and second pulse input signals 1 and 2. The level shift device further contains a third input terminal 304 for receiving a third pulse input signal 3. The pulse generation circuit 30 controls the number of pulse output signals produced within each cycle according to third pulse input signal 3. More specifically, the third pulse input signal 3 resets the pulse generation circuit 30 so that the pulse generation circuit 30 terminates a current cycle and starts a next cycle.

Figure 4:
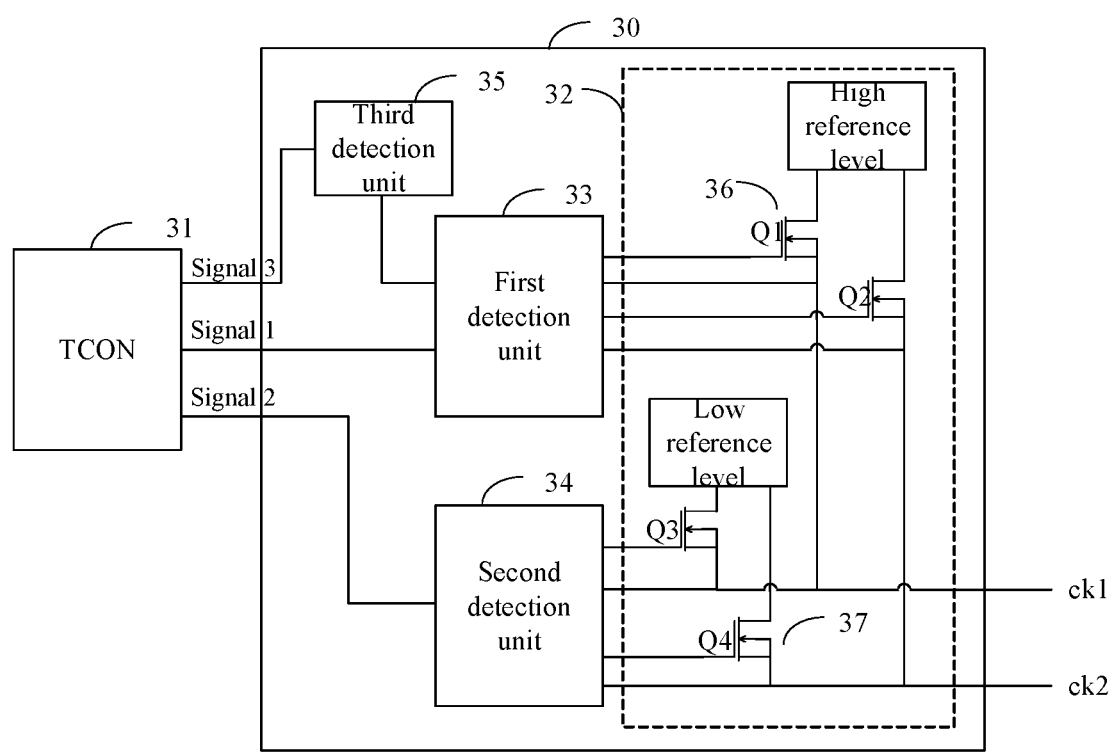
FIG. 4 is a functional block diagram showing a pulse generation circuit of the level shift device of FIG. 3.

As shown in FIG. 4, the pulse generation circuit 30 contains a pulse generation unit 32, a first detection unit 33, a second detection unit 34, and a third detection unit 35. The first detection unit 33 is for receiving the first pulse input signal 1 and, in response to the first pulse input signal 1, triggers the pulse generation unit 32 to sequentially produce a rising edge in each pulse output signal. The second detection unit 34 is for receiving the second pulse input signal 2 and, in response the second pulse input signal 2, triggers the pulse generation unit 32 to sequentially produce a falling edge in each pulse output signal. The third detection unit 35 is for receiving the third pulse input signal 3 and, in response to the third pulse input signal 3, resets the first detection unit 33.

The pulse generation unit 32 contains a number of first switches 36 and a number of second switches 37. Each output terminal 303 is connected to a first switch 36 and a second switch 37. The first detection unit 33, in response to each controlling edge of the first pulse input signal 1, turns on the first switch 36 and the second detection unit 34 turns off the second switch 37 connected to each output terminal 303 sequentially so that each output terminal 303 is connected to a high reference level. The second detection unit 34, in response to each controlling edge of the second pulse input signal 2, turns on the second switch 37 and the first detection unit 33 turns off the first switch 36 connected to each output terminal 303 sequentially so that each output terminal 303 is connected to a low reference level. The third detection unit 35, in response to each controlling edge of the third pulse input signal 3, controls the first detection unit 33 to terminate a currently cycle of pulse output signals, and to start a new cycle where a first rising edge in a first pulse output signal is produced at the first pulse input signal 1's next controlling edge.

Preferably, the first switches 36 and the second switches 37 are MOS transistors. Using two output terminals as example, as shown in FIG. 4, a first output terminal producing pulse output signal ck1 is connected to a MOS transistor Q1 (i.e., the first switch 36) and another MOS transistor Q3 (i.e., the second switch 37). On the other hand, a second output terminal producing pulse output signal ck2 is connected a MOS transistor Q2 (i.e., the first switch 36) and another MOS transistor Q4 (i.e., the second switch 37). The MOS transistor Q1 has its gate connected to the first detection unit 33, its drain connected to the high reference level, and its source connected to the first detection unit 33 and the first output terminal. The MOS transistor Q2 has its gate connected to the first detection unit 33, its drain connected to the high reference level, and its source connected to the first detection unit 33 and the second output terminal. The MOS transistor Q3 has its gate connected to the second detection unit 34, its drain connected to the low reference level, and its source connected to the second detection unit 34 and the first output terminal. The MOS transistor Q4 has its gate connected to the second detection unit 34, its drain connected to the low reference level, and its source connected to the second detection unit 34 and the second output terminal. If the pulse generation unit 32 has more than 2 output terminals, for example 4, 6, or 8 output terminals, a first switch 36 is connected between the first detection unit 33 and each output terminal whereas a second switch 37 is connected between the second detection unit 34 and each output terminal.

When the first detection unit 33 detects a rising edge in the first pulse input signal 1, the MOS transistor Q1 is turned on by the first detection unit 33, and the MOS transistor Q3 is turned off by the second detection unit 34. The first output terminal outputs the high reference level in the pulse output signal ck1. When the second detection unit 34 detects a rising edge in the second pulse input signal 2, the MOS transistor Q4 is turned on by the second detection unit 34, and the MOS transistor Q2 is turned off by the first detection unit 33. The first output terminal outputs the low reference level in the pulse output signal ck1.

After the high or low reference level is produced in the pulse output signal ck1, source voltage of the MOS transistor Q1 is fed back to the first detection unit 33. When a next rising edge of the first pulse input signal 1 arrives, the MOS transistor Q2 is turned on and the MOS transistor Q4 is turned off. The second output terminal outputs the high reference level in the pulse output signal ck2. When a next rising edge of the second pulse input signal 2 arrives, the MOS transistor Q2 is turned off and the MOS transistor Q4 is turned on. The second output terminal outputs the low reference level in the pulse output signal ck2.

Figure 1:
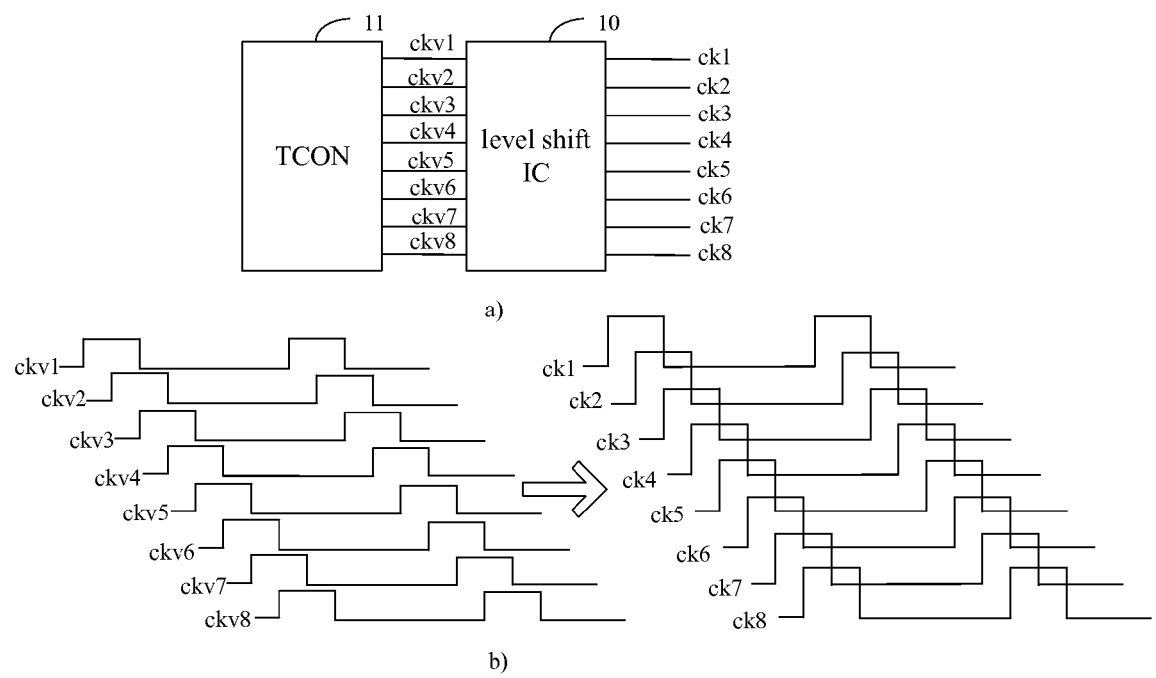
FIG. 1(a) is a schematic diagram showing how a conventional level shift IC in a GOA (Gate Driver on Array) circuit is connected.
FIG. 1(b) is a waveform diagram showing the input and output clock signals of the conventional level shift IC of FIG. 1(a)
Figure 2:
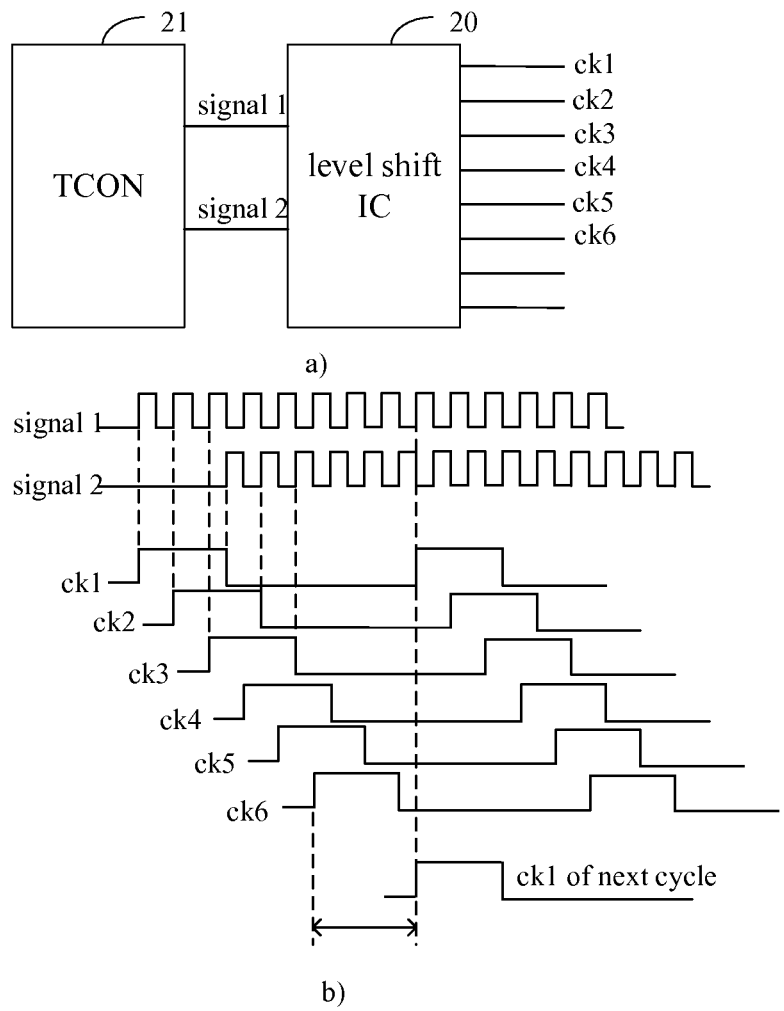
FIG. 2(a) is a schematic diagram showing how another conventional level shift IC in a GOA circuit is connected.
FIG. 2(b) is a waveform diagram showing the input and output clock signals of the conventional level shift IC of FIG. 2(a)
Figure 5:
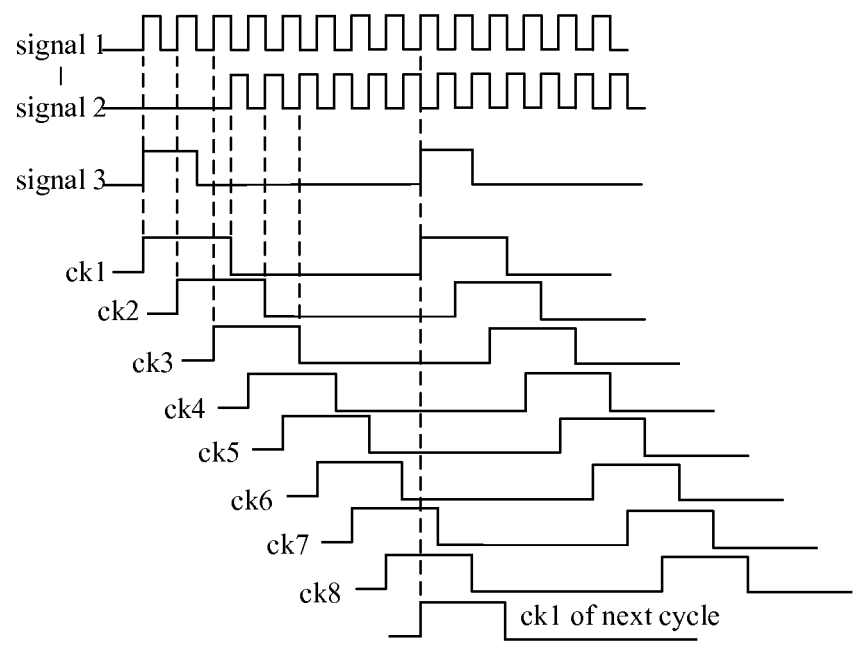
FIG. 5 is a waveform diagram produced by the level shift device of FIG. 3 where there are 8 pulse output signals.
Figure 6:
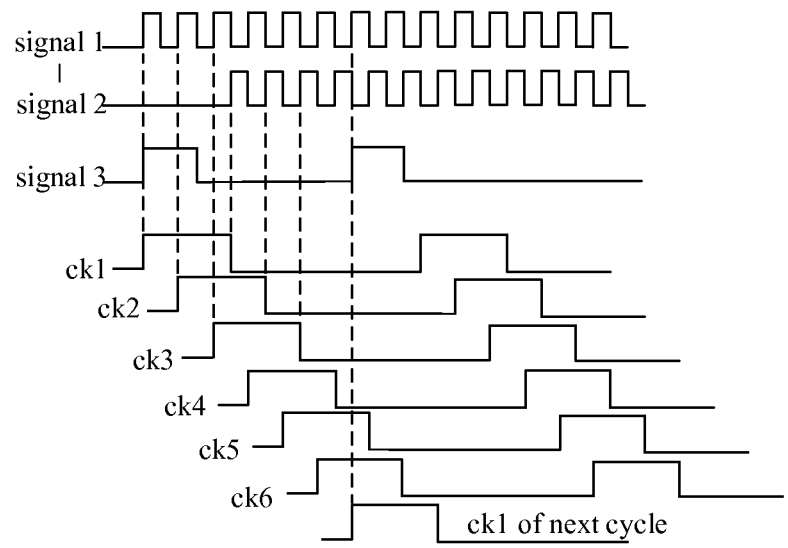
FIG. 6 is a waveform diagram produced by the level shift device of FIG. 3 where there are 6 pulse output signals.
Figure 7:
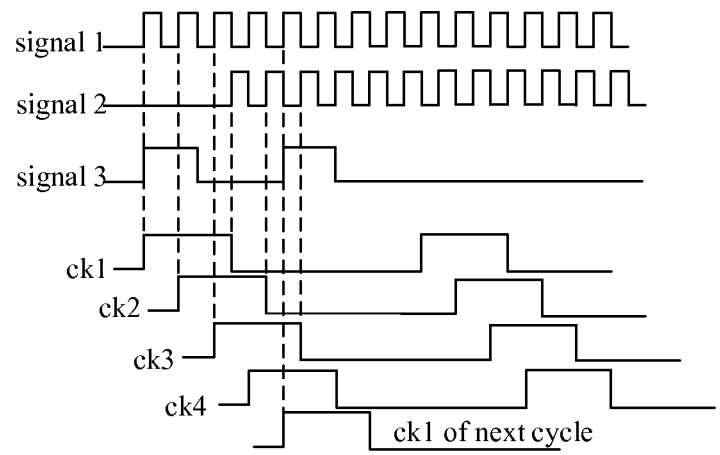
FIG. 7 is a waveform diagram produced by the level shift device of FIG. 3 where there are 4 pulse output signals.

When the third detection unit 35 detects a rising edge in the third pulse input signal 3, it controls the first detection unit 33 to terminate the current cycle and turns on the MOS transistor Q1 when the third pulse input signal 3 and the first pulse input signal 1 are both at the rising edge. The first output terminal outputs the high reference level in the pulse output signal ck1, thereby entering a new cycle. As such, the number of rising edges in the first pulse input signal 1 between two consecutive rising edges in the third pulse input signal 3 determines the number of output terminals. FIGS. 5 to 7 show application scenarios providing various numbers of output terminals. FIG. 5 shows an application having 8 output terminals, FIG. 6 shows an application having 6 output terminals, and FIG. 7 shows an application having 4 output terminals. As illustrated, the level shift device according to the present invention can provide various numbers of output terminals. The number of pulse output signals can be adjusted in accordance with application requirement without introducing delay in the pulse output signals, as shown FIG. 2.

In the present embodiment, the third pulse input signal 3 has a frequency that is at least $1/4$, $1/6$, or $1/8$ of the first pulse input signal 1's frequency. The third pulse input signal 3 can be obtained directly by frequency division from the first pulse input signal 1. The second and first pulse input signals 2 and 1 have an identical frequency. The second pulse input signal 2 can be obtained directly by shifting the first pulse input signal 1.

Figure 8:
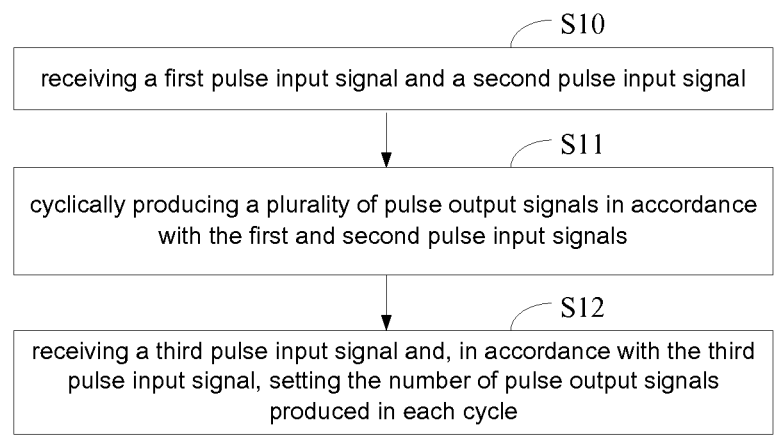
FIG. 8 is a flow diagram showing the steps of a level shift method according to an embodiment of the present invention.

FIG. 8 is a flow diagram showing the steps of a level shift method according to an embodiment of the present invention. As illustrated, the level shift method contains the following steps.

In step S10, a first pulse input signal and a second pulse input signal are received.

The first and second pulse input signals are of a same frequency. The second pulse input signal can be obtained by shifting the first pulse input signal.

In step S11, a number of pulse output signals are cyclically produced in accordance with the first and second pulse input signals.

In response to the first pulse input signal, step S11 produces a rising edge sequentially in each pulse output signal. Similarly, in response to the second pulse input signal, step S11 produces a falling edge sequentially in each pulse output signal. Preferably, each rising edge in the first pulse input signal triggers the rising edge in a next pulse output signal, and each rising edge in the second pulse input signal triggers the falling edge in a next pulse output signal.

In step S12, a third pulse input signal is received and, in accordance with the third pulse input signal, the number of pulse output signals in each cycle is set.

In response to each controlling edge of the third pulse input signal, step S12 terminates a current cycle of pulse output signals and starts a next cycle of pulse output signals. Preferably, when the first and third pulse input signals are both at their rising edges, the current cycle of pulse output signals is terminated, and a first rising edge in a first pulse output signal of the next cycle is produced. By employing the third pulse input signal to start and end the cycles of pulse output signals, the present invention is able to produce various numbers of pulse output signals with a fewer number of pulse input signals. The present invention is therefore flexible enough for different applications without investing a new design or introducing excessive delays in the pulse output signals.

In the present embodiment, the third pulse input signal has a frequency at least $1/4$, $1/6$, or $1/8$ of the first pulse input signal's frequency. The third pulse input signal can be obtained directly by frequency division from the first pulse input signal.

As described, the present invention employs the first and second pulse input signals to control the rising and falling edges for each pulse output signal in cycles of pulse output signals. Then, the third pulse input signal is used to terminate a current cycle and start a new cycle. The present invention is therefore able to produce various numbers of pulse output signals suitable for different applications.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A level shift device comprising a first input terminal, a second input terminal, a third input terminal, a plurality of output terminals, and a pulse generation circuit, wherein
   the first input terminal is for receiving a first pulse input signal; the second input terminal is for receiving a second pulse input signal; the third input terminal is for receiving a third pulse input signal;
   the pulse generation circuit cyclically produces pulse output signals, one on each output terminal, according to the first and second pulse input signals;
   the pulse generation circuit controls the number of pulse output signals produced within each cycle of pulse output signals according to the third pulse input signal where a current cycle is terminated and a next cycle is started in accordance with each controlling edge of the third pulse input signal; and
   the third pulse input signal has a frequency that is ¼, ⅙, or ⅛ of the first pulse input signal's frequency.

2. The level shift device as claimed in claim 1, wherein the pulse generation circuit comprises
   a pulse generation unit;
   a first detection unit for receiving the first pulse input signal that, in response to the first pulse input signal, triggers the pulse generation unit to produce a rising edge sequentially in each pulse output signal;
   a second detection unit for receiving the second pulse input signal that, in response to the second pulse input signal, triggers the pulse generation unit to produce a falling edge sequentially in each pulse output signal; and
   a third detection unit for receiving the third pulse input signal that, in response to the third pulse input signal, resets the first detection unit.

3. A level shift device comprising a first input terminal, a second input terminal, a third input terminal, a plurality of output terminals, and a pulse generation circuit, wherein
   the first input terminal is for receiving a first pulse input signal; the second input terminal is for receiving a second pulse input signal; the third input terminal is for receiving a third pulse input signal;
   the pulse generation circuit cyclically produces pulse output signals, one on each output terminal, according to the first and second pulse input signals; and
   the pulse generation circuit controls the number of pulse output signals produced within each cycle of pulse output signals according to the third pulse input signal.

4. The level shift device as claimed in claim 3, wherein the pulse generation circuit terminates a current cycle and starts a next cycle in accordance with each controlling edge of the third pulse input signal.

5. The level shift device as claimed in claim 3, wherein the pulse generation circuit comprises
   a pulse generation unit;
   a first detection unit for receiving the first pulse input signal that, in response to the first pulse input signal, triggers the pulse generation unit to produce a rising edge sequentially in each pulse output signal;
   a second detection unit for receiving the second pulse input signal that, in response to the second pulse input signal, triggers the pulse generation unit to produce a falling edge sequentially in each pulse output signal; and
   a third detection unit for receiving the third pulse input signal that, in response to the third pulse input signal, resets the first detection unit.

6. The level shift device as claimed in claim 3, wherein the third pulse input signal has a frequency that is ¼, ⅙, or ⅛ of the first pulse input signal's frequency.

7. A level shift method, comprising the steps of:
   receiving a first pulse input signal and a second pulse input signal;
   cyclically producing a plurality of pulse output signals in accordance with the first and second pulse input signals; and
   receiving a third pulse input signal and, in accordance with the third pulse input signal, setting the number of pulse output signals produced in each cycle.

8. The method as claimed in claim 7, wherein the step of setting the number of pulse output signals comprises the step of, in response to each controlling edge of the third pulse input signal, terminating a current cycle of pulse output signals and starting a next cycle of pulse output signals.

9. The method as claimed in claim 7, wherein the step of cyclically producing a plurality of pulse output signals comprise the steps of, in response to the first pulse input signal, producing a rising edge sequentially in each pulse output signal; and, in response to the second pulse input signal, producing a falling edge sequentially in each pulse output signal.

10. The method as claimed in claim 7, wherein the third pulse input signal has a frequency that is ¼, ⅙, or ⅛ of the first pulse input signal's frequency.

* * * * *